(12) United States Patent
Pevzner et al.

(10) Patent No.: US 11,653,484 B2
(45) Date of Patent: May 16, 2023

(54) PRINTED CIRCUIT BOARD AUTOMATED LAYUP SYSTEM

(71) Applicant: RAYTHEON COMPANY, Waltham, MA (US)

(72) Inventors: Mikhail Pevzner, Woburn, MA (US); James E. Benedict, Lowell, MA (US); Andrew R. Southworth, Lowell, MA (US); Wade A. Schwanda, Westbrook, MA (US)

(73) Assignee: RAYTHEON COMPANY, Waltham, MA (US)

( * ) Notice: Subject to any disclaimer, the term of this patent is extended or adjusted under 35 U.S.C. 154(b) by 803 days.

(21) Appl. No.: 16/678,211

(22) Filed: Nov. 8, 2019

(65) Prior Publication Data

US 2021/0144892 A1 May 13, 2021

(51) Int. Cl.
 *H05K 13/04* (2006.01)
 *H05K 3/46* (2006.01)
 (Continued)

(52) U.S. Cl.
 CPC ......... *H05K 13/0409* (2018.08); *H05K 3/38* (2013.01); *H05K 3/465* (2013.01); *H05K 3/4638* (2013.01);
 (Continued)

(58) Field of Classification Search
 CPC .......... H05K 13/0409; H05K 13/0413; H05K 3/0008; H05K 3/38; H05K 3/4638;
 (Continued)

(56) References Cited

U.S. PATENT DOCUMENTS

| 2006/0261536 A1 | 11/2006 | Dangelewicz et al. |
| 2008/0205008 A1 | 8/2008 | Sun et al. |

(Continued)

FOREIGN PATENT DOCUMENTS

| CN | 103945649 A | 7/2014 |
| JP | 2009013313 A * | 1/2009 |

(Continued)

OTHER PUBLICATIONS

Kiswanto et al, "Development of Robotic Arm Manipulator Control System for Micromilling Tool Wear Monitoring Based on Computer Vision," 2021 7th International Conference on Mechatronics and Robotics Engineering (ICMRE), 2021, pp. 69-76. (Year: 2021).*

(Continued)

*Primary Examiner* — A. Dexter Tugbang
(74) *Attorney, Agent, or Firm* — Lando & Anastasi, LLP

(57) ABSTRACT

An apparatus to automatically place layers of a printed circuit board on a fixture includes a robotic device having a base that is secured to a surface, an upright column that extends upwardly from the base, and a movable arm rotatably coupled to the upright column. The movable arm is configured to rotate about a vertical axis defined by the upright column. The movable arm is further configured to rotate from a position in which the movable arm is disposed over a laminate sheet fixture and to pick up a laminate sheet to a position in which the movable arm is disposed over a board layup fixture to deposit the laminate sheet in the board layup fixture, and from a position in which the movable arm is disposed over a bond film fixture and to pick up a bond film to a position in which the movable arm is disposed over the board layup fixture to deposit the bond film in the board layup fixture.

23 Claims, 16 Drawing Sheets

(51) Int. Cl.
*H05K 3/38* (2006.01)
*H05K 3/00* (2006.01)
*B29C 64/379* (2017.01)
*B25J 18/00* (2006.01)

(52) U.S. Cl.
CPC ....... *H05K 3/4679* (2013.01); *H05K 13/0413* (2013.01); *B25J 18/00* (2013.01); *B29C 64/379* (2017.08); *B32B 2457/08* (2013.01); *H05K 3/0008* (2013.01); *H05K 2203/167* (2013.01)

(58) Field of Classification Search
CPC ................ H05K 3/465; H05K 3/4679; H05K 2203/167; B32B 2457/08; B29C 64/379; B25J 18/00
See application file for complete search history.

(56) References Cited

U.S. PATENT DOCUMENTS

| | | |
|---|---|---|
| 2015/0027640 A1 | 1/2015 | Yasumoto et al. |
| 2015/0104283 A1* | 4/2015 | Nogami .................. B25J 18/00 414/730 |
| 2016/0044798 A1 | 2/2016 | Kawata et al. |
| 2019/0150296 A1 | 5/2019 | Southworth et al. |
| 2019/0269021 A1 | 8/2019 | Nufio-Molina et al. |

FOREIGN PATENT DOCUMENTS

| | | | |
|---|---|---|---|
| JP | 2016215532 A | 12/2016 | |
| JP | 2019160973 A * | 9/2019 | ............ B25J 13/085 |
| WO | 2014127377 A1 | 8/2014 | |

OTHER PUBLICATIONS

International Search Report and Written Opinion in International Patent Application No. PCT/US2020/058538 dated Feb. 17, 2021.
International Search Report and Written Opinion in International Patent Application No. PCT/US2020/058540 dated Feb. 15, 2021.

* cited by examiner

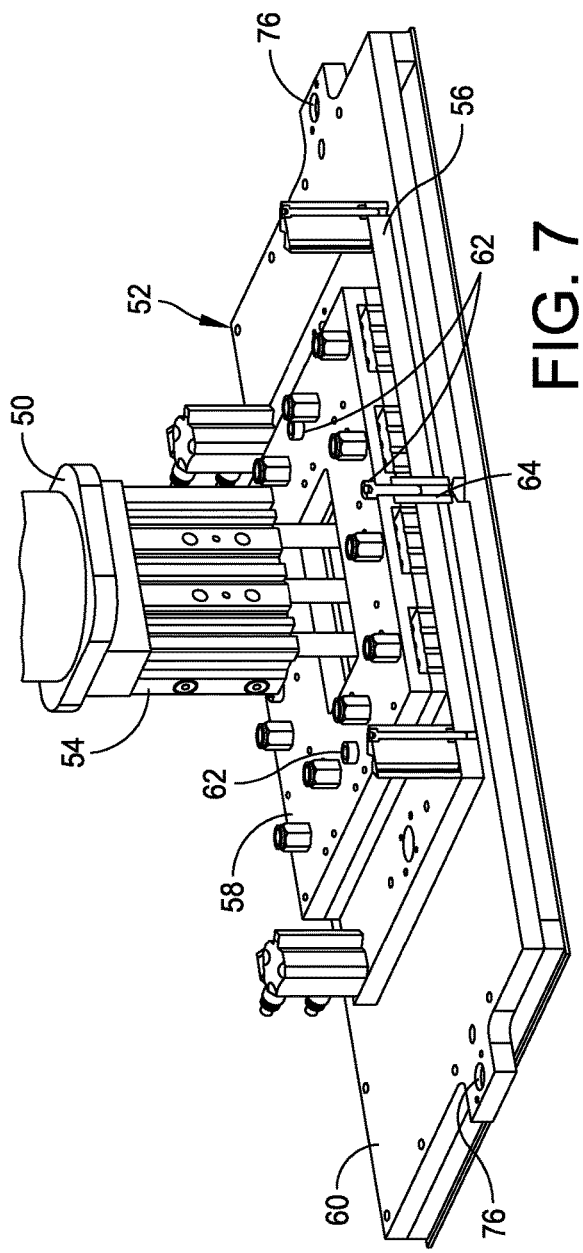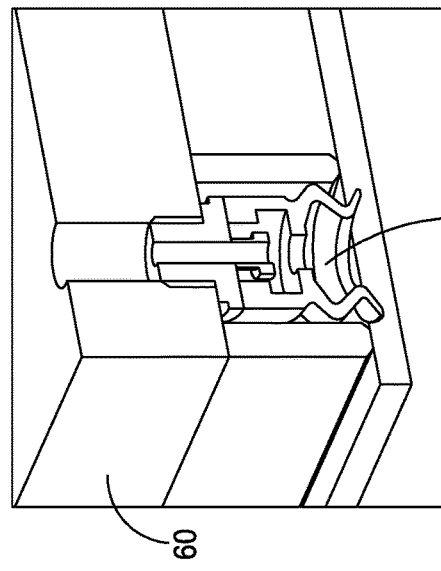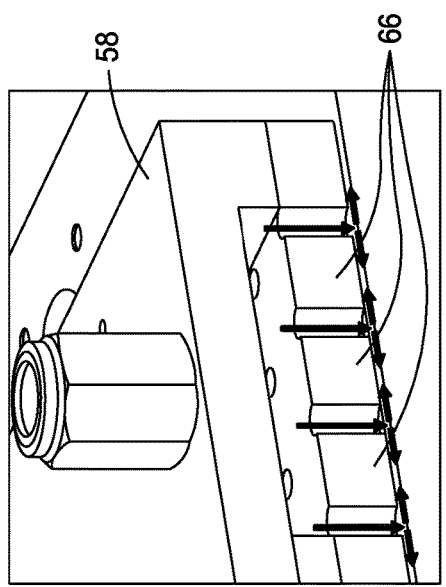

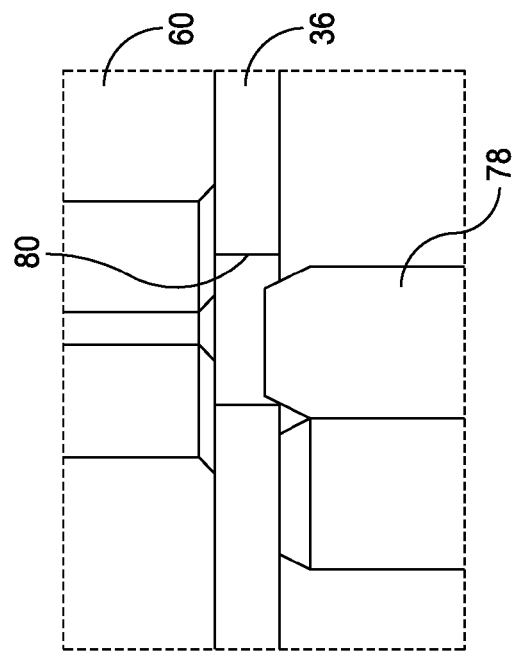
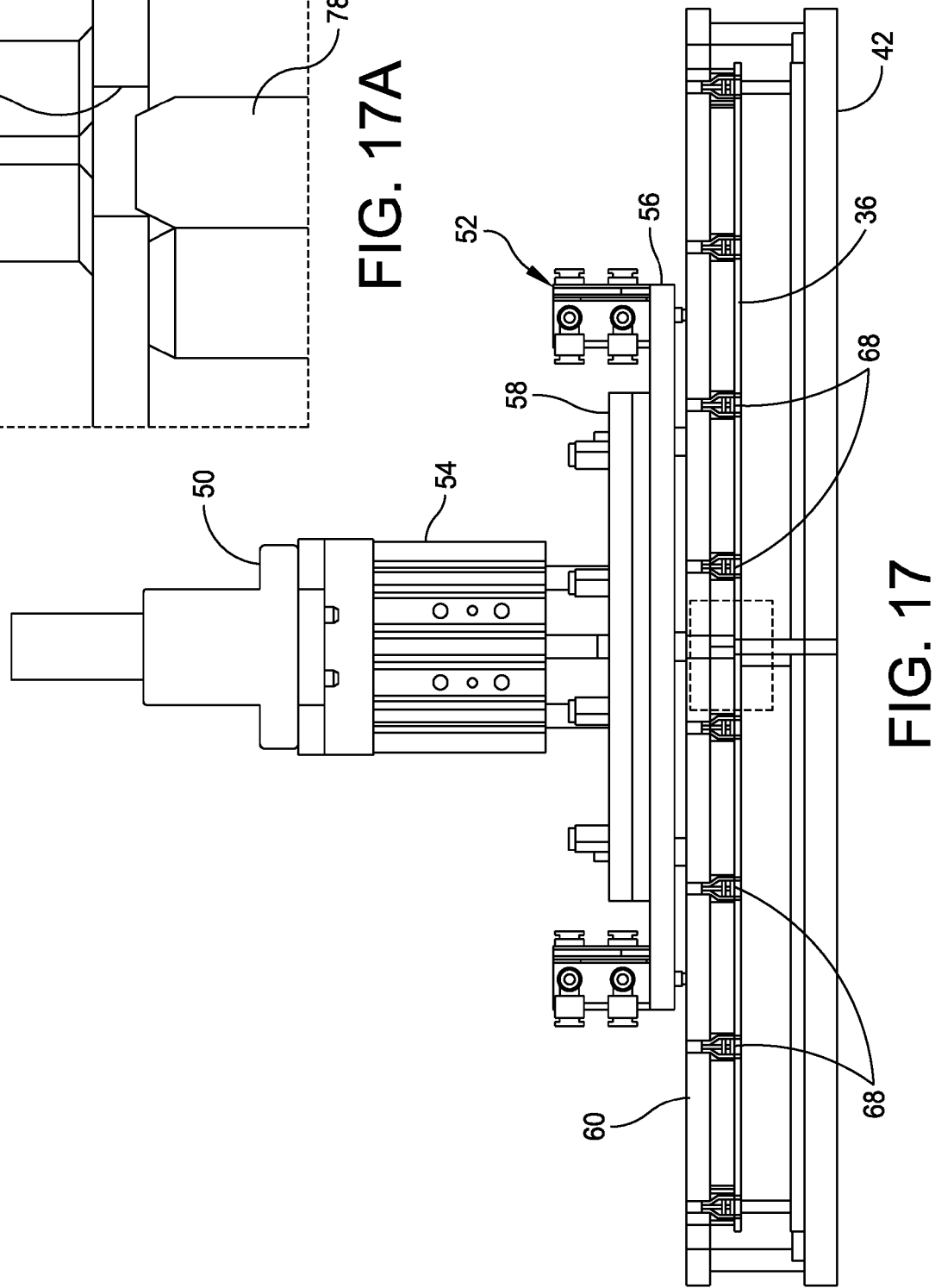

PRINTED CIRCUIT BOARD AUTOMATED LAYUP SYSTEM

RELATED APPLICATION

This application relates to U.S. patent application Ser. No. 16/678,188 titled "METHOD FOR FORMING CHANNELS IN PRINTED CIRCUIT BOARDS BY STACKING SLOTTED LAYERS", by Mikhail Pevzner, Andrew R. Southworth, James E. Benedict and Gregory G. Beninati, filed on even date herewith, which is incorporated herein by reference in their entirety for all purposes.

GOVERNMENT RIGHTS

Not applicable.

BACKGROUND

Radio frequency (RF) and electromagnetic circuits may be manufactured using conventional printed circuit board (PCB) processes. Conventional PCB manufacturing processes may include lamination, electroplating, masking, etching, and other complex process steps, and may require multiple steps, expensive and/or hazardous materials, multiple iterations, extensive labor, etc., all leading to higher cost and slower turnaround time.

Today, in a standard PCB fabrication process, PCB manufacturers manually perform a board layup operation by hand-placing laminate sheets and bond films on a fixture or some other device prior to laminating the stacked sheets and films. FIG. 1 illustrates such a manual board layup operation in which a fixture 10 is used to receive laminate sheets and bond films. Although automation exists in other PCB fabrication processes, such as pick-and-place machines, the equipment used with these types of processes do not address issues related to board layup operations. Such issues include and are not limited to electrostatic discharge, foreign object infiltration, achieving high tolerance standards, and damaging materials.

There are multiple implementations machines that are capable of picking up sheet materials, none of which address accurate placement of the sheets onto fixtures with high tolerance alignment pins, or address electrostatic discharge and surface damage concerns, considerations that are critical to PCB fabrication. Existing pick and/or place solutions for sheet materials include but are not limited to an electroadhesion robot gripper, which can cause electrostatic discharge and surface contamination. Another solution includes a suction cup mechanism used to pick up sheet metal, which can damage the PCB surface and is required to stay intact in order to enable proper laminate bonding, grippers. This mechanism is not practical for sheet material handling.

SUMMARY

One aspect of the present disclosure is directed to an apparatus to automatically place layers of a printed circuit board on a fixture. In one embodiment, the apparatus comprises a robotic device including a base that is secured to a surface, an upright column that extends upwardly from the base, and a movable arm rotatably coupled to the upright column. The movable arm is configured to rotate about a vertical axis defined by the upright column, and configured to rotate from a position in which the movable arm is disposed over a laminate sheet fixture and to pick up a laminate sheet to a position in which the movable arm is disposed over a board layup fixture to deposit the laminate sheet in the board layup fixture, and a position in which the movable arm is disposed over a bond film fixture and to pick up a bond film to a position in which the movable arm is disposed over the board layup fixture to deposit the bond film in the board layup fixture.

Embodiments of the apparatus further may include configuring the movable arm of the robotic device to move in x-axis and y-axis directions but rigid in a z-axis direction. The movable arm may be configured to vary a radius of arc and travel about the vertical axis and configured to lower and raise an end effector supported by the movable arm in a z-axis direction. The robotic device may be a selective compliance assembly robot arm. The movable arm may include a user flange that is configured to receive and mount thereon the end effector. The end effector may be configured to pick up the laminate sheet from the laminate sheet fixture and place the laminate sheet on the board layup fixture and to the bond film from the bond film fixture and place the bond film on the board layup fixture. The end effector may include an actuator that is secured to the user flange and to a fixed plate, with the movable arm being configured to move the fixed plate vertically in the z-axis direction. The fixed plate may be disposed on a horizontal plane and supports a vacuum tool having top floating plate and a bottom floating plate, which is secured to the top floating plate. The top floating plate and the bottom floating plate are configured to move relative to the fixed plate in the x-axis and y-axis directions. The top floating plate may include a plurality of ports, which are connected to a source of air. The ports provide an air cushion between the top floating plate and the fixed plate to facilitate a small amount of movement between the top and bottom floating plates and the fixed plate when aligning the bottom floating plate with one of the laminate sheet, bond film and board layup fixtures. The bottom floating plate may include a plurality of suction cups, which are configured to releasably secure the laminate sheet to the bottom floating plate. Each suction cup may be secured to a vacuum source, and by applying vacuum to the suction cups, the bottom floating plate releasably secures the laminate sheet to the bottom floating plate and by terminating vacuum to the suction cups, the bottom floating plate releases the laminate sheet from the bottom floating plate. The suction cups may be disposed around a periphery of a bottom surface of the bottom floating plate. The bottom floating plate may include a plurality of vacuum ports, which are configured to releasably secure the bond film to the bottom floating plate. Each vacuum port may be secured to a vacuum source, and by applying vacuum to the vacuum ports, the bottom floating plate releasably secures the bond film to the bottom floating plate and by terminating vacuum to the vacuum ports, the bottom floating plate releases the bond film from the bottom floating plate. The vacuum ports may be uniformly arranged on a bottom surface of the bottom floating plate. Each of the laminate sheet fixture, the bond film fixture and the board layup fixture include a flat plate having at least one alignment pin, which is provided to initially position the bottom floating plate with respect to the fixture when moving an end effector of the robotic device to the fixture. The at least one alignment pin may be received within an opening provided in the bottom floating plate. Each fixture further may include a plurality of additional pins to finely locate the laminate sheet with slots provided in the laminate sheet. The apparatus further may include a table configured to support the robotic device, with the base of the robotic device being secured to the table and the table being configured to support complimentary components of the robotic device. The apparatus further may include a controller to control the operation of the robotic device.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures may be represented by a like numeral. For purposes of clarity, not every component may be labeled in every figure. In the figures:

FIG. 7 is an enlarged view of the end effector configured to releasably secure laminate sheets;

FIG. 8A is an enlarged view of an air cushion provided between a fixed plate and a vacuum tool of the end effector;

FIG. 8B is an enlarged view of a suction cup of the end effector;

FIG. 13A is an enlarged cross-sectional view of a pin of the sheet or film fixture used to align the end effector and the sheet or film fixture with the pin being partially received in an opening of the end effector;

FIG. 14A is an enlarged cross-sectional view of the pin of the sheet or film fixture used to align the end effector and the sheet or film fixture with the pin being fully received in an opening of the end effector;

FIG. 17 is a cross-sectional side view of the end effector taken from an orthogonal side showing the end effector moved toward the board layup fixture;

FIG. 17A is an enlarged cross-sectional view of other pins of the board layup fixture used to align the end effector and the board layup fixture with the pins being partially received in openings of the laminate sheet;

DETAILED DESCRIPTION

Figure 1:
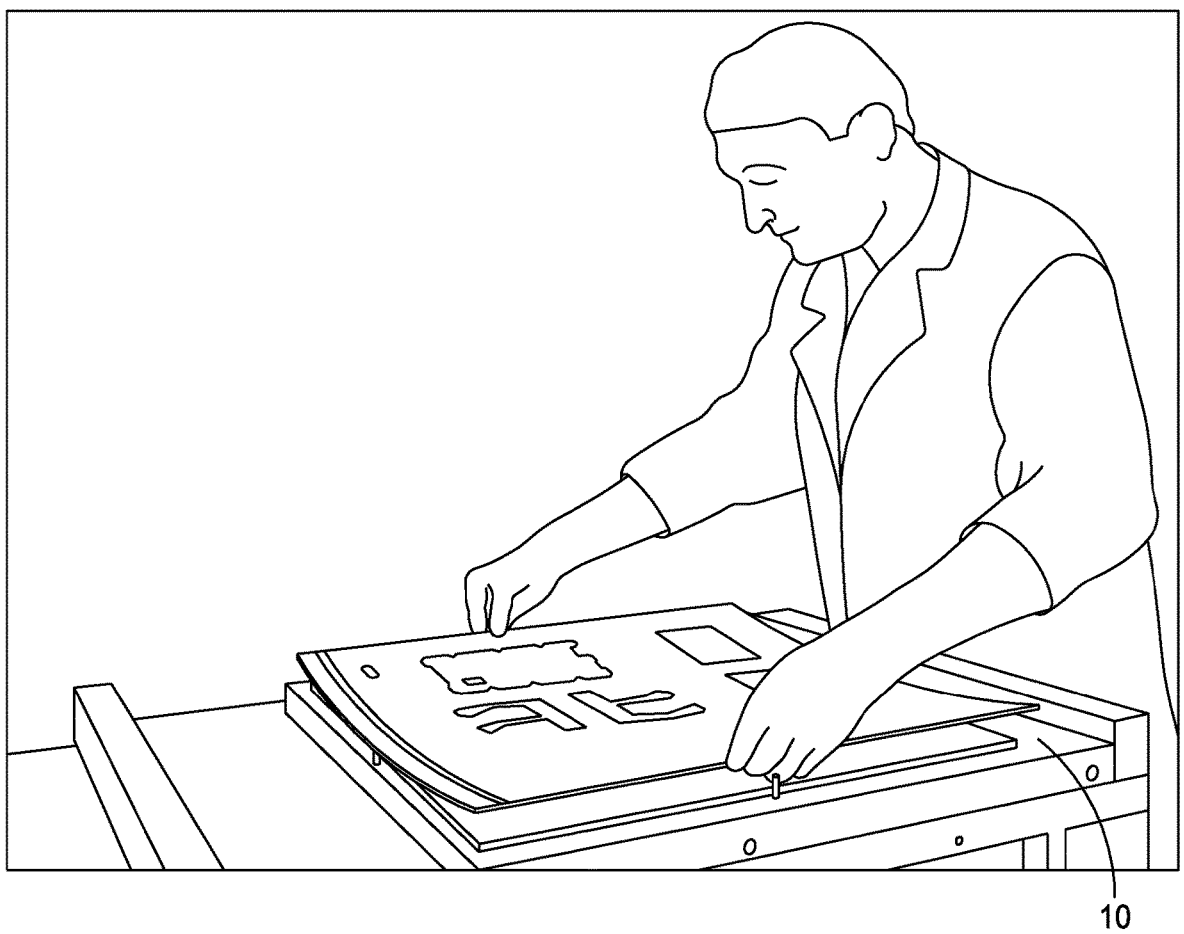
FIG. 1 is a view of a manual printed circuit board (PCB) layup process.

Various aspects and embodiments are directed to printed circuit boards (PCBs), and improved methods of manufacture of the same. More specifically, embodiments of the present disclosure are directed to manufacturing radio frequency (RF) circuit card assemblies. In a standard PCB fabrication process, PCB manufacturers perform the board layup operation manually. A board layup operation involves alternately placing laminate sheets and bond films (and other types of sheets) on a fixture, such as fixture 10, until a desired structure is attained. Once stacked, the laminate sheets and bond films are then cured under pressure and temperature to form an integral final product having a uniform thickness. Embodiments of the apparatus disclosed herein provide an automated means to achieve a board layup operation.

Still other aspects, examples, and advantages are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Various aspects and embodiments described herein may include means for performing any of the described methods or functions.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

The process for PCB layup fabrication in which laminate and bond film layers or sheets are placed onto a platen or fixture with highly tolerance alignment pins is a highly manual process as described above. Thus, the size and shape of the laminate and bond film layers prevent the PCB fabrication process from being fully automated. Furthermore, the use of standard vacuum source suction cups to pick the flexible bond film layers produces deformation of the layers which prevents the ability to accurately place the layers to a board layup fixture. This is something the bond film pick tool disclosed herein is designed to overcome. Embodiments of the apparatus disclosed herein are configured to place laminate sheets and bond films (and other types of sheet material) having a variety of shapes and sizes on a fixture designed to receive such laminate sheets and bond films.

An apparatus of embodiments of the present disclosure provides an automated approach to performing a PCB layup operation, which entails placing sheet material onto a fixture having alignment pins. In some embodiments, the apparatus embodies a robotic system with tooling and fixtures that are capable of picking up thin sheet PCB laminates and thin flexible bond films, and accurately locating and placing the laminates and the films on a lamination press platen/fixture having alignment pins. Embodiments of the apparatus disclosed herein automates PCB fabrication.

Embodiments of the apparatus of the present disclosure include a pick tooling device that is configured with a low friction X-Y end effector capable of generating an air cushion between a fixed plate and a vacuum tool to releasably secure the laminate sheet and enabling accurate alignment to pick/place pin features of a fixture. In one embodiment, the pick tooling device contains an array of 8 mm diameter vacuum cups that contact the laminate sheet within a margin, leaving a sensitive central region of the laminate sheet untouched. Any size diameter vacuum cups can be employed. The fixture includes alignment pins that are received within openings provided in the pick tooling device to accurately place the laminate sheet. In another embodiment, the pick tooling device includes pin hole vacuum grippers to releasably secure thin flexible laminates and films, such as bond films. Vacuum is pulled through array of holes in a back plate of the pick tooling device.

Figure 2:
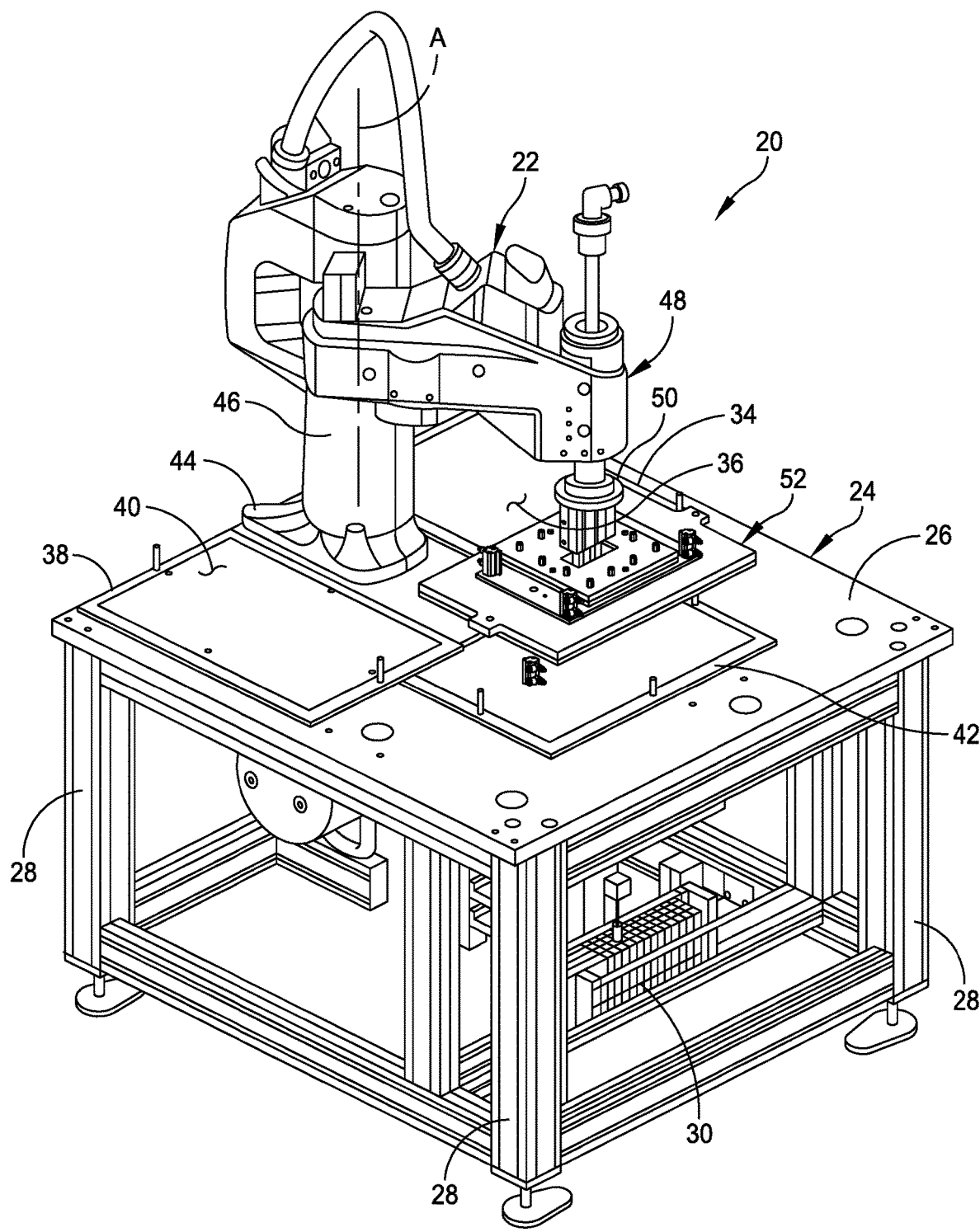
FIG. 2 is a perspective view of a PCB automated layup apparatus.

Referring to the drawings, and more particularly to FIG. 2, a PCB automated layup apparatus is generally indicated at 20. The apparatus 20 employs a robotic system to provide an automated approach to performing PCB layup operation, which entails placing sheet material onto a fixture having alignment pins, which currently is a manual process performed by PCB manufacturers in a standard fabrication process. Embodiments of the robotic system include tooling and fixtures that are capable of picking up thin sheet PCB laminates and thin flexible films and accurately locating and placing the laminates and films on a lamination press platen/fixture having alignment pins. As noted above, this is a challenging task given the high alignment tolerances.

As shown, the apparatus 20 includes a robotic device, generally indicated at 22, and a base or table, generally indicated at 24, that is configured to support the robotic device 22 and components of the robotic device 22. In one embodiment, the table 24 includes a flat horizontal top 26 supported by four legs, each indicated at 28. As shown, each leg 28 includes a leveler provided at a bottom of the leg to ensure that the horizontal top 26 is level with respect to a horizontal plane. The table 24 includes internal supports provided under the horizontal top 26 to support equipment used to operate the robotic device 22 provided on the table 24. For example, the table 24 supports a valve bank 30 and air valves 32; however, the table 24 can be configured to support any number of components associated with the apparatus 20. The table 24 can be fabricated from a structurally strong material, such as stainless steel. It should be noted that table 24 can embody any suitable structure that is capable of supporting the robotic device 22 and the components of the robotic device 22, such as a bench or a movable cart.

Figure 3:
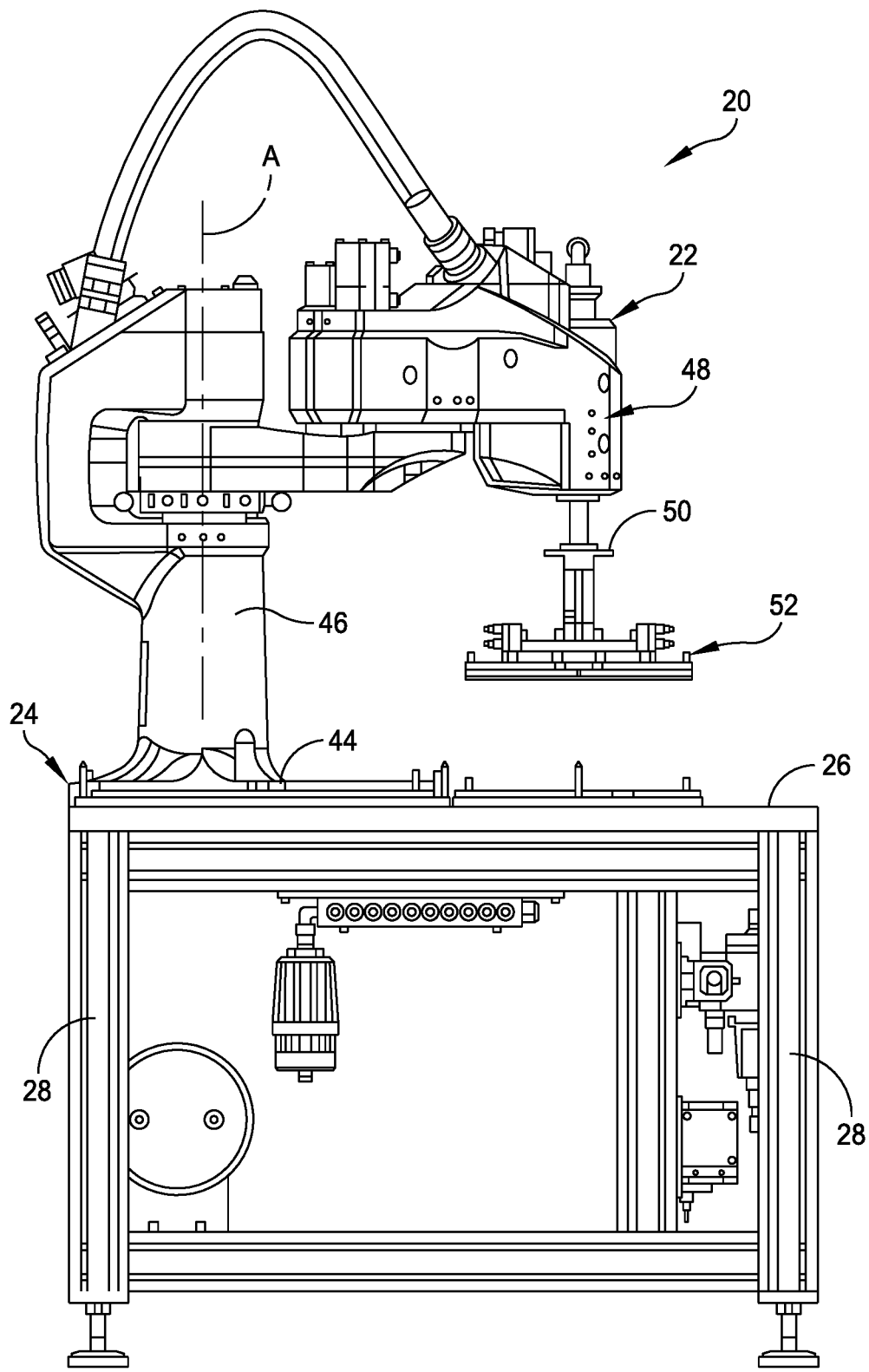
FIG. 3 is a front elevation view of the apparatus.
Figure 4:
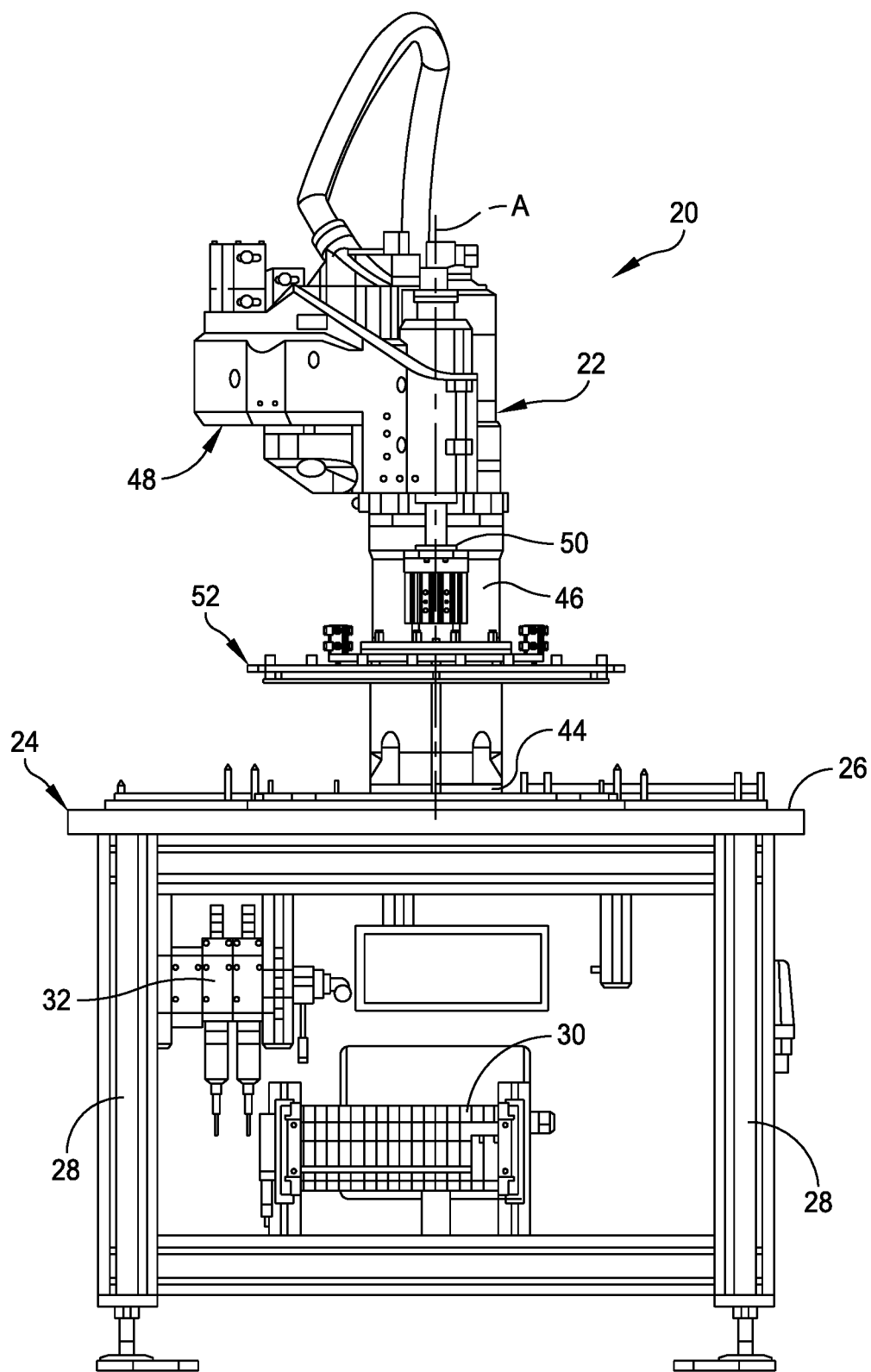
FIG. 4 is a side elevation view of the apparatus.
Figure 5:
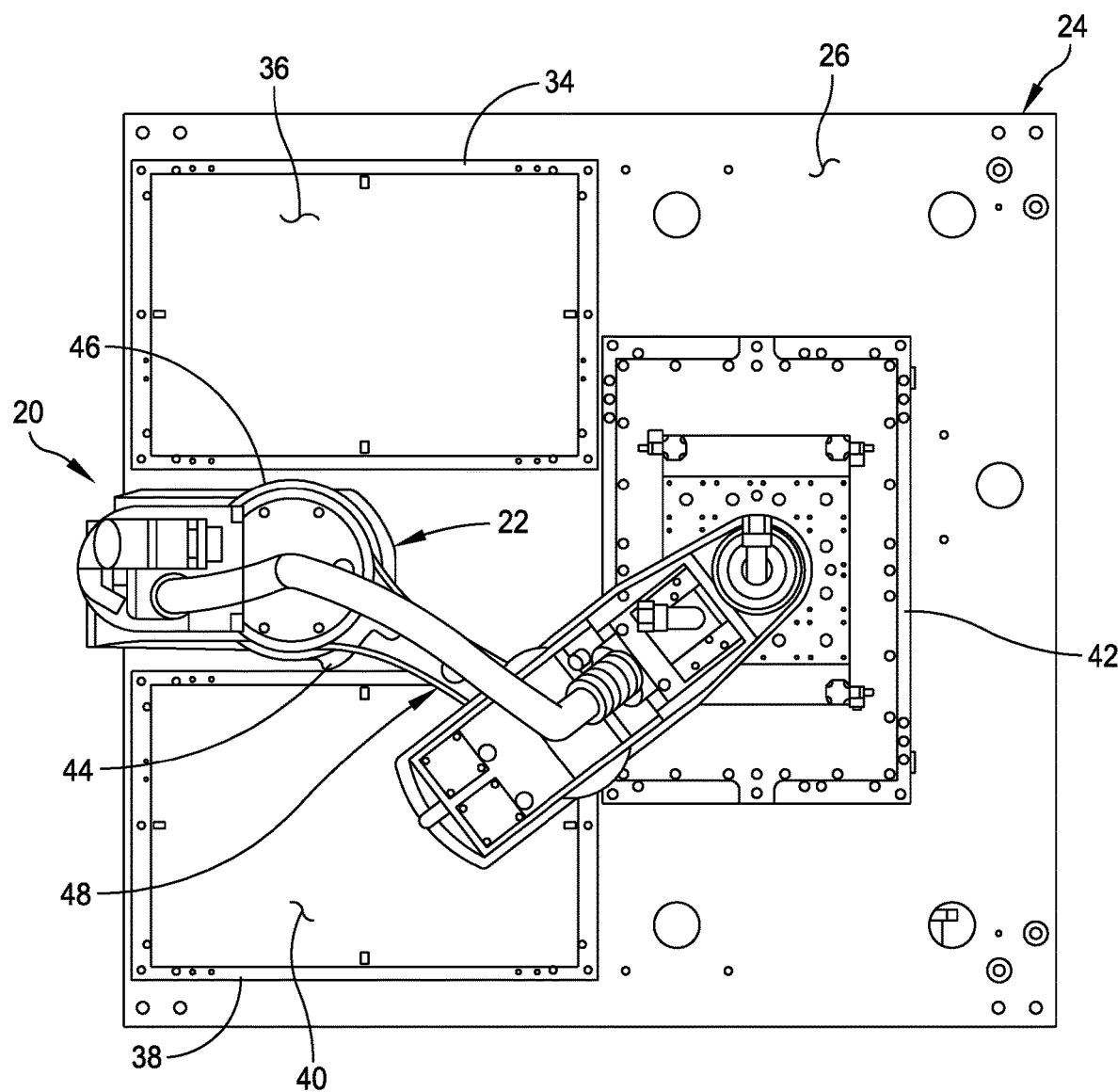
FIG. 5 is a top plan view of the apparatus.

Referring additionally to FIGS. 3-5, the robotic device 22 is positioned on the horizontal top 26 of the table 24 adjacent an edge of the table 24. In the shown embodiment, the positioning of the robotic device 22 provides space in front of and to the sides of the robotic device 22. Located at one side of the robotic device 22 is a laminate sheet pick nest fixture 34 that contains a stack of laminate sheets, each indicated at 36. Located on the other side of the robotic device 22 is a bond film pick nest fixture 38 that contains a stack of bond films, each indicated at 40. Located in front of the robotic device 22 is a board layup fixture 42, which is configured to receive alternating layers of laminate sheets 36 and bond films 40, for example. The construction of the laminate sheet fixture 34, the bond film fixture 38 and the board layup fixture 42 will be described in greater detail as the description of the apparatus 20 proceeds.

In one embodiment, the robotic device 22 includes a base 44 that is secured to the horizontal top 26 of the table 24, an upright column 46 that extends upwardly from the base 44, and a movable arm, generally indicated at 48, rotatably coupled to the upright column 46. In one embodiment, the base 44 of the robotic device 22 is secured to the horizontal top 26 by bolts to fixedly secure the robotic device 22 on the table 26. The movable arm 48 is configured to rotate about a vertical axis A defined by the upright column 46. In the shown embodiment, the movable arm 48 is capable of rotating from a position in which the movable arm 48 is disposed over the laminate sheet fixture 34 to a position in which the movable arm 48 is disposed over the bond film fixture 38. During its travel, the movable arm 48 can be positioned over the board layup fixture 42 as well.

In one embodiment, the robotic device 22 is a robot that can be purchased from a commercial vender, such as a selective compliance assembly (or articulated) robot arm or SCARA, which includes a movable arm that is movable in the x-axis and y-axis directions and includes a z-axis and theta motion at the end of the arm. The robotic device 22 is particularly suited for transferring parts from one area to another area and for loading and unloading parts. The movable arm 48 of the robotic device 22 is capable of varying a radius of arc and travel about the vertical axis A and capable of lowering and raising an end effector supported by the movable arm 48 in a z-axis direction.

The movable arm 48 of the robotic device 22 includes a user flange 50 that is configured to receive and mount thereon an end effector, generally indicated at 52. Two end effectors are provided, one for picking up and releasing laminate sheets 36 and one for picking up and releasing bond films 40. In one embodiment, the end effector 52 is configured to pick up a laminate sheet 36 from the laminate sheet fixture 34 and place the laminate sheet 36 on the board layup fixture 42. In another embodiment, the end effector 52a, which is described in greater detail below, is configured to pick up a bond film 40 from the bond film fixture 38 and place the bond film 40 on the board layup fixture 42. This process is repeated until the complete laminate is stacked on the board layup fixture 42. Once stacking of the layers 36, 40 is completed, the laminate product is subject to further processing steps, such as curing as by heat and pressure.

Figure 6:
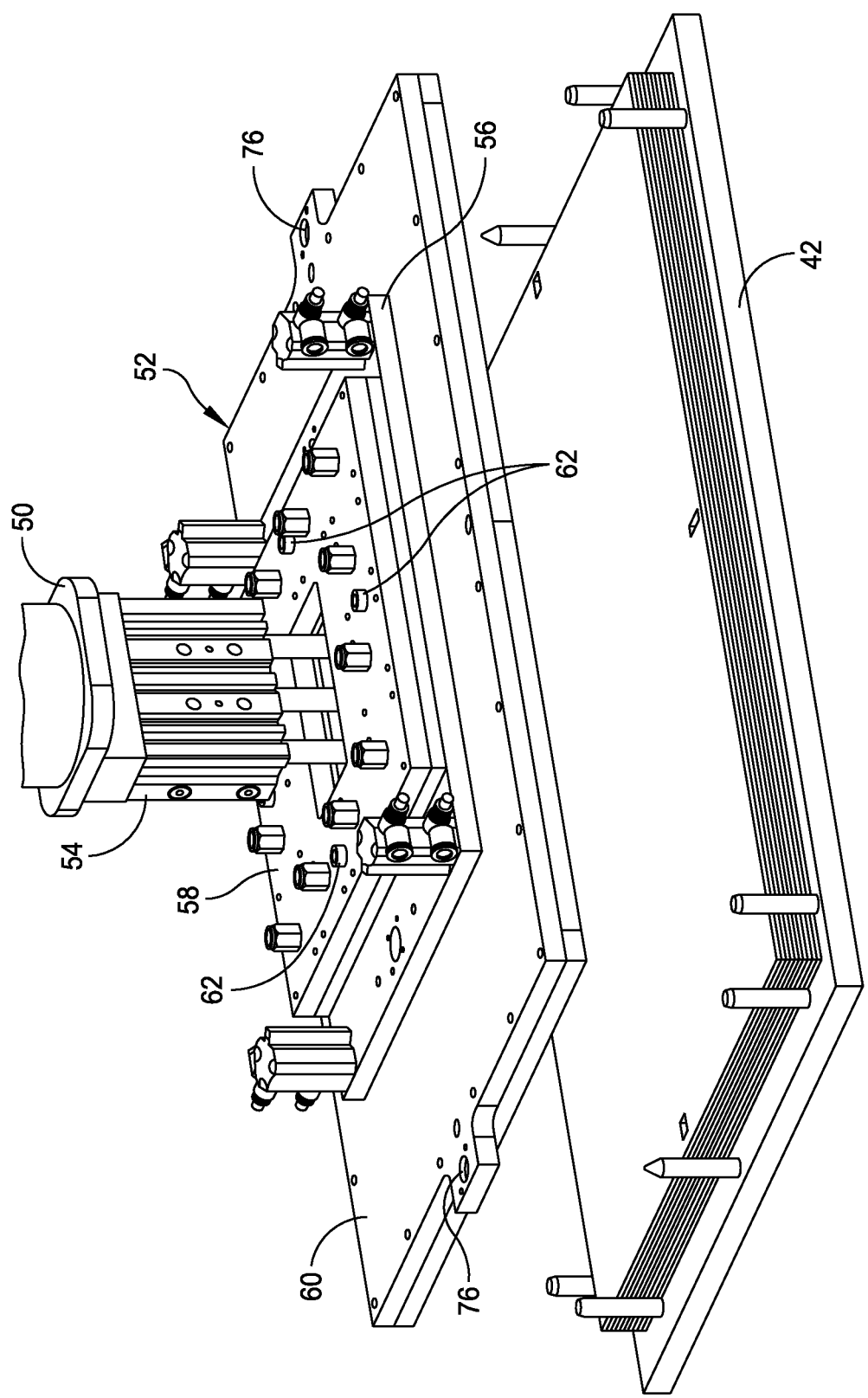
FIG. 6 is a perspective view of an end effector and a fixture of the apparatus.

Referring to FIG. 6, in one embodiment, the end effector 52 includes a guided pneumatic cylinder, referred to herein as a guided pneumatic actuator 54, that is secured to a fixed plate 56. As shown, the guided pneumatic actuator 54 is secured to the user flange 50. The movable arm 48 includes a z-axis actuator configured to provide z-axis motion to move the user flange 50 and the guided pneumatic actuator 54 in the z-axis direction. The guided pneumatic actuator 54 provides air spring compliance by a regulated air supply to the end effector 52 to offer "crash protection" in the event there is a gross misalignment between the end effector and any of the pick or place fixtures. A cylinder is configured to compress to protect the movable arm 48 and the end effector 52 from damage.

The fixed plate 56 is disposed on a horizontal plane and supports a vacuum tool having top floating plate 58 and a bottom floating plate 60, which is secured to the top floating plate 58. The arrangement is such that the top floating plate 58 and the bottom floating plate 60 are configured to move relative to the fixed plate 56 in the x-axis and y-axis directions. As shown, several fasteners, each indicated at 62, secure the top floating plate 58 to the bottom floating plate 60. As shown in FIG. 7, the fasteners 62 extend through openings 64 formed in the fixed plate 56. The limit of travel of the top and bottom floating plates 58, 60 with respect to the fixed plate 56 is determined by the sizes of the openings 64 in the fixed plate 56 and the amount of play between the fasteners 62 and the openings 64. In one embodiment, the amount of travel or play between the top and bottom floating plates 58, 60 and the fixed plate 56 is approximately 1-2 mm in a horizontal plane. The importance of this limited movement will be apparent as the descriptions of the end effector 52 and the end effector 52a and the fixtures 34, 38, 42 proceeds.

Referring to FIGS. 7 and 8A, which shows end effector 52, the top floating plate 58 includes a plurality of ports, each indicated at 66, which are connected to a source of air, e.g., the air valves 32. During operation, the ports 66 provide an air cushion between the top floating plate 58 and the fixed plate 56 and facilitate a small amount of movement between the top and bottom floating plates 58, 60 and the fixed plate 56 when aligning the bottom floating plate 60 with one of the fixtures 34, 38, 42. This small amount of movement is especially important when aligning the end effector 52 with the fixture 34, 38 or 42 in the manner described below. The source of air can be drawn from an air tank in fluid communication with the air valves 32 and secured to the support of the table 24 to provide compressed air to the end effector 52.

Referring to FIGS. 7 and 8B, the bottom floating plate 60 of end effector 52 includes a plurality of suction cups, indicated at 68, which are configured to releasably secure a laminate sheet 36 or a bond film 40 to the bottom floating plate 60. Each suction cup 68 is secured to a vacuum source, such as a vacuum ejector 88 shown in FIG. 19, which can be secured to the support of the table 24 to provide vacuum to the end effector 52. The suction cups 68 are disposed around the periphery of a bottom surface of the bottom floating plate 60 so as to not negatively effect a circuit pattern provided on a top surface of a laminate sheet 36. By applying vacuum to the suction cups 68, the bottom floating plate 60 releasably secures a laminate sheet 36 to the bottom floating plate 60. And by terminating vacuum to the suction cups 68, the bottom floating plate 60 releases the laminate sheet 36 or the bond film 40 from the bottom floating plate 60. Thus, the end effector 52 is capable of picking up and placing laminate sheet material to desired locations.

Figure 9:
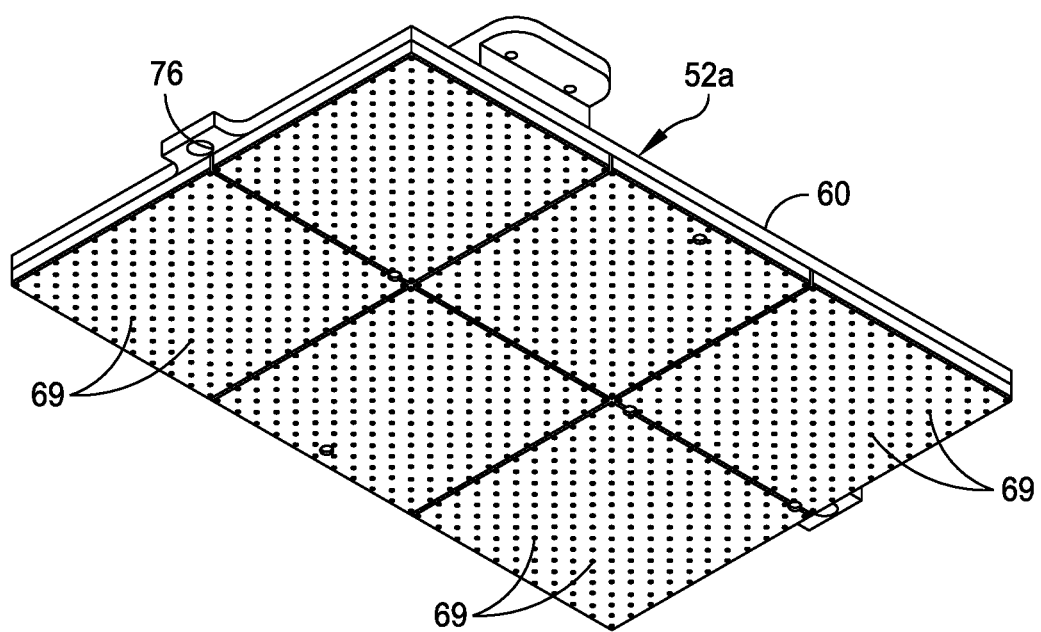
FIG. 9 is a bottom perspective view of an end effector configured to releasably secure bond film.

Referring to FIG. 9, which illustrates the end effector 52a configured to pick up a bond film 40, the bottom floating plate 60 further includes a plurality of vacuum ports, each indicated at 69, which are configured to releasably secure the bond film to the bottom floating plate 60. Each vacuum port 69 is secured to a vacuum source, such as the vacuum ejector 88 shown in FIG. 19, which can be secured to the support of the table 24 to provide vacuum to the end effector 52a. The ports 69 are uniformly arranged in a series of rows and columns on the bottom surface of the bottom floating plate 60 so as to not negatively affect a circuit pattern provided on a top surface of a laminate sheet 36. By applying vacuum to the ports 69, the bottom floating plate 60 releasably secures a bond film 40 to the bottom floating plate 60. And by terminating vacuum to the ports 69, the bottom floating plate 60 releases the bond film 40 from the bottom floating plate 60. Thus, the end effector 52a is capable of picking up and placing bond film to desired locations while limiting deformation to the bond film during the pick up and placing process.

During operation, the end effectors 52 and 52a are alternately secured to the user flange of the movable arm 48 when placing laminate sheets 36 and bond films 40, respectively.

Figure 10:
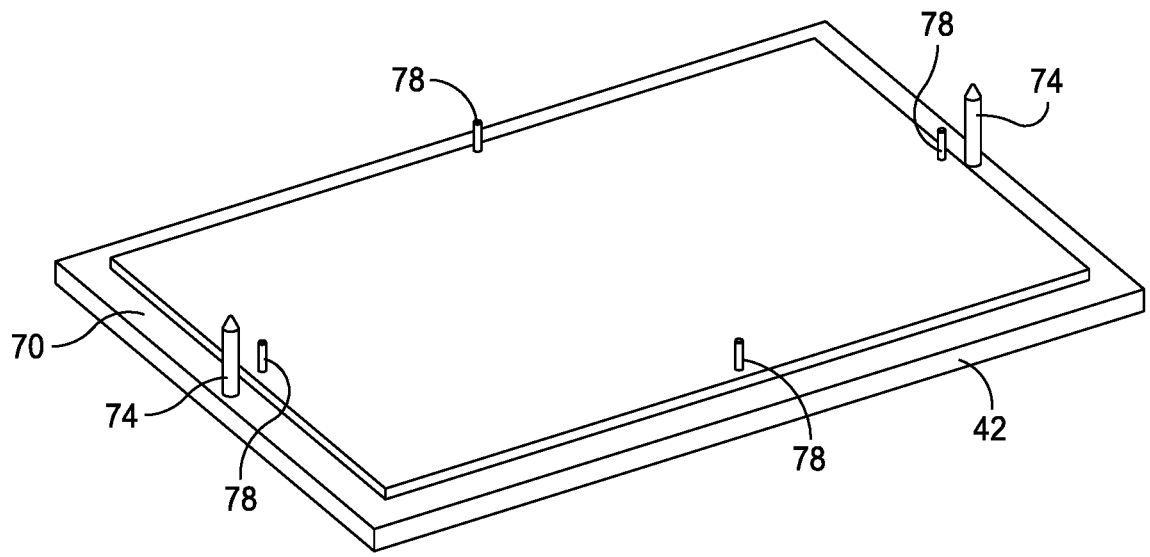
FIG. 10 is a perspective view of the fixture.
Figure 11:
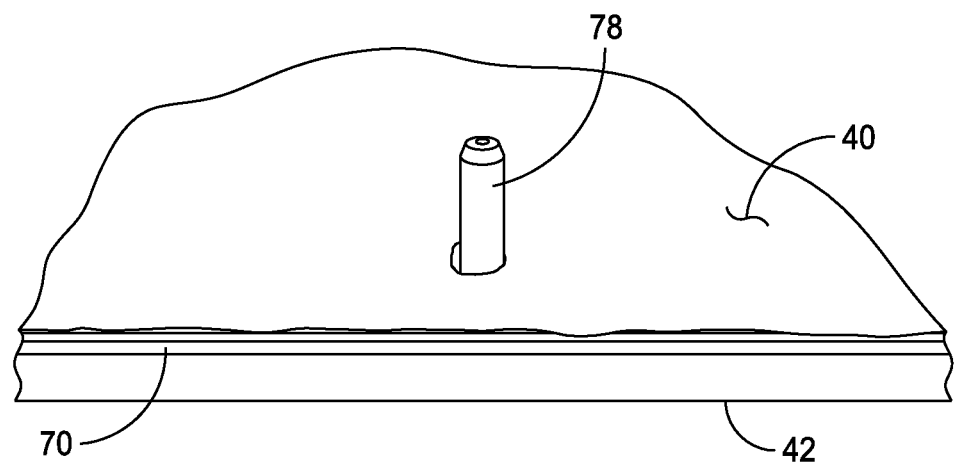
FIG. 11 is an enlarged perspective view of an alignment pin of the fixture.

Referring to FIG. 10, the board layup fixture 42 is illustrated. It should be noted that the laminate sheet fixture 34 and the bond film fixture 38 can be similarly if not identically constructed as the board layup fixture 42. As shown, the board layup fixture 42 includes a flat plate 70 having two alignment pins, each indicated at 74, which are provided to initially position the bottom floating plate 60 with respect to the board layup fixture 42 when moving the end effector 52 or 52a to the board layup fixture 42. The arrangement is such that when placing the end effector 52 or 52a over the board layup fixture 42, the alignment pins 74 are received within openings, indicated at 76, provided in the bottom floating plate 60 at the long ends of the bottom floating plate 60. As the two alignment pins 74 enter their respective openings 76, the alignment pins 74 enable the end effector 52 or 52a to be centered with respect to the board layup fixture 42 in a relatively gross manner, while four additional pins, each indicated at 78 of the board layup fixture 42 finely locate the laminate sheet 36 with four aligned slots 80 (FIG. 17A) provided in the laminate sheet 36. FIG. 11 illustrates one of the pins 78 extending through an opening of a bond film 40, which is 0.0015 inches in thickness. For each of the laminate sheet fixture 34 and the bond film fixture 38, a plurality of upstanding pins, which are positioned to define a perimeter of the laminate sheet 36 and/or bond film 40 being placed on the flat plate. In one embodiment, two pins are provided on each corner of the flat plate. The product, e.g., laminate sheet and/or bond film, placed on the flat plate can be accurately located by the pins within a tolerance of 0.008 inches.

Figure 12:
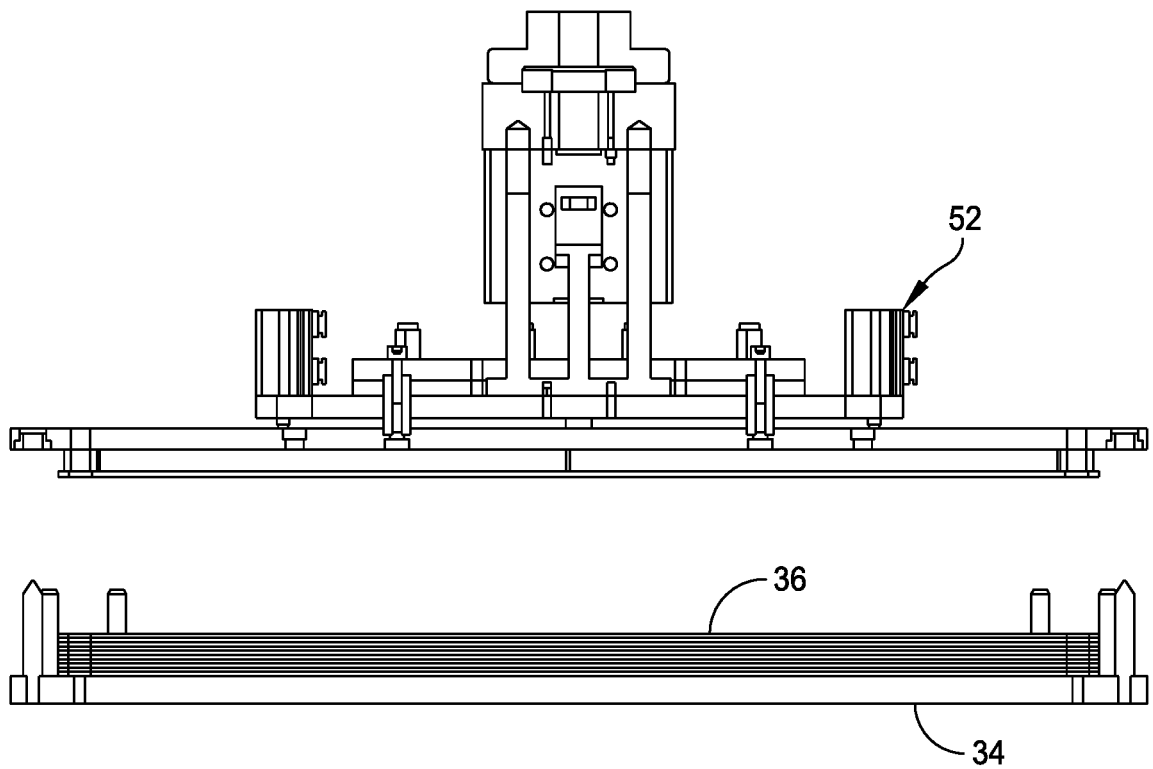
FIG. 12 is cross-sectional side view of the end effector spaced from a sheet or film fixture of the apparatus.
Figure 13:
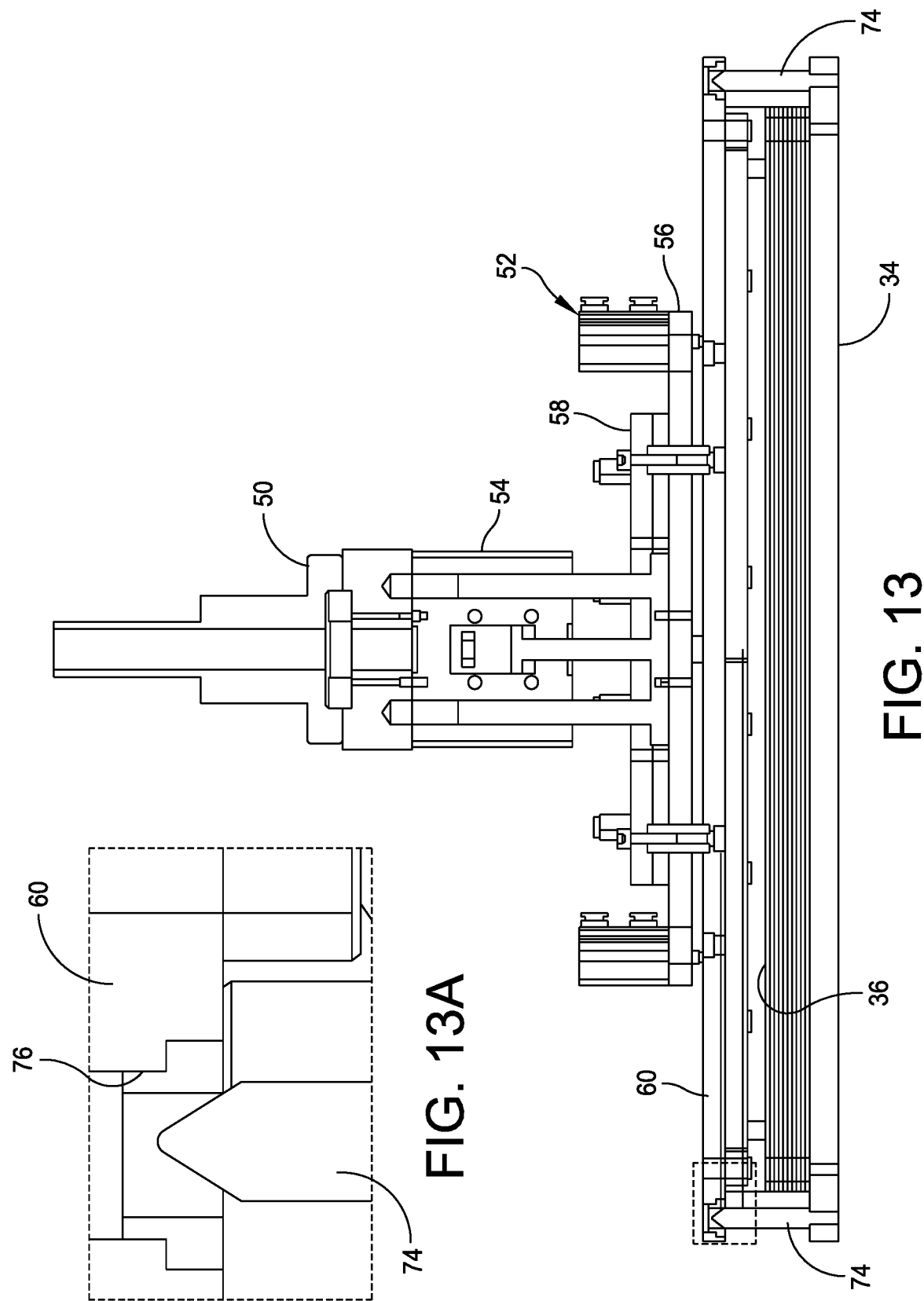
FIG. 13 is a cross-sectional side view of the end effector moved toward the sheet or film fixture.

FIGS. 12-18 illustrate a sequence of operation in which the end effector 52 picks up a thin sheet, e.g., a laminate sheet 36, from a fixture, e.g., the laminate sheet fixture 34, moves the laminate sheet 36, and places the laminate sheet 36 in the board layup fixture 42. FIG. 12 illustrates the end effector 52 placed over the laminate sheet fixture 34. The end effector 52 is positioned over the laminate sheet fixture 34 by moving the movable arm 48 over the laminate sheet fixture 34. FIGS. 13 and 13A illustrate the end effector 52 being moved downward over the laminate sheet fixture 34, with the alignment pins 74 being received in their respective openings 76 to grossly align the end effector 52 with the laminate sheet fixture 34. To achieve the downward movement of the end effector 52, the movable arm 48 is operated to move the end effector 52 downwardly in the z-axis direction. At this point, the source of air is controlled to deliver pressurized air to the ports 66, thereby providing an air cushion between the top floating plate 58 and the fixed plate 56. The air cushion between the top floating plate 58 and the fixed plate 56 facilitates a small amount of movement between the top and bottom floating plates 58, 60 and the fixed plate 56 when aligning the bottom floating plate 60 with the board layup fixture 42.

Figure 14:
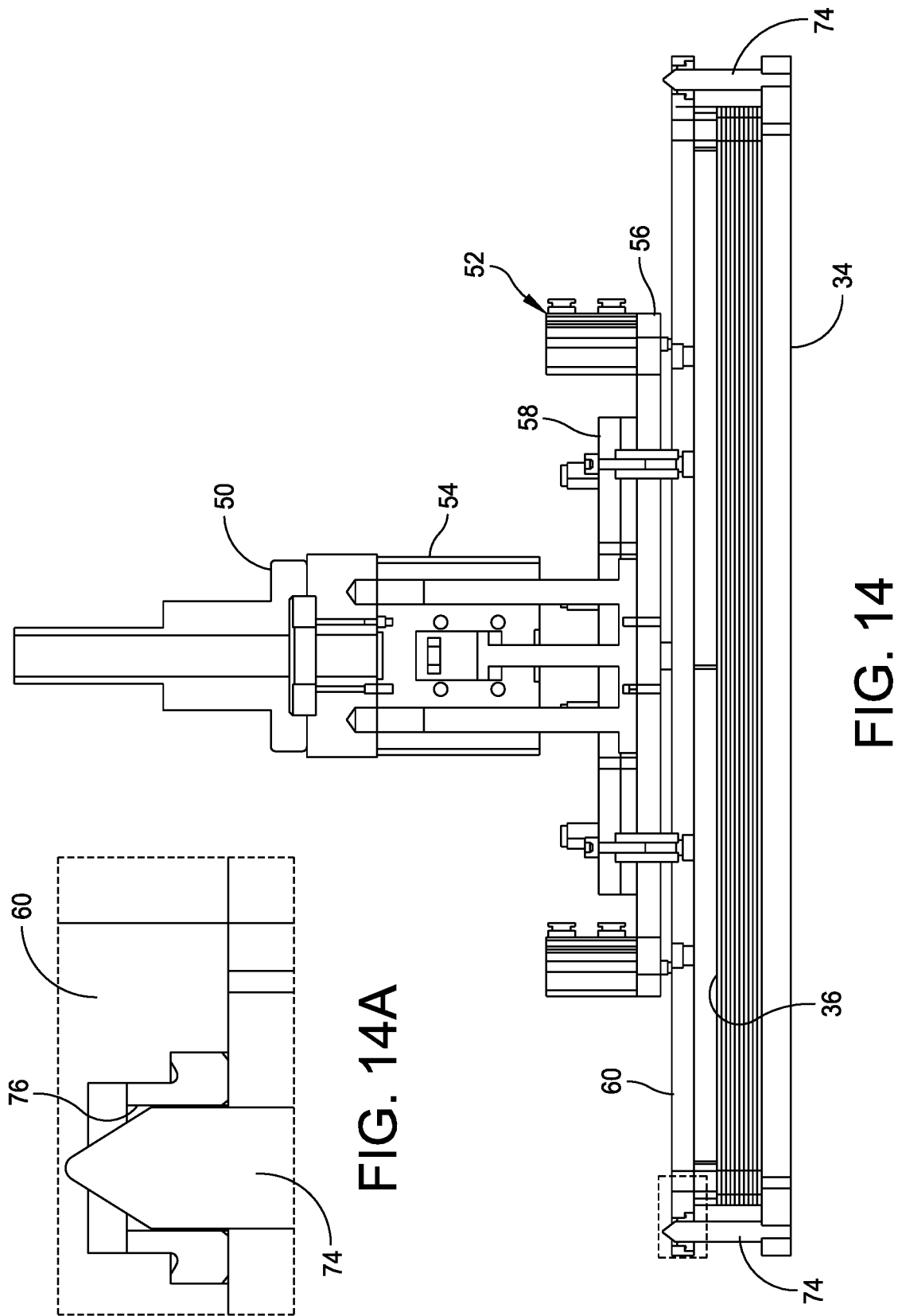
FIG. 14 is a cross-sectional side view of the end effector moved fully toward the sheet or film fixture to pick a sheet or film provided in the sheet or film fixture.
Figure 15:
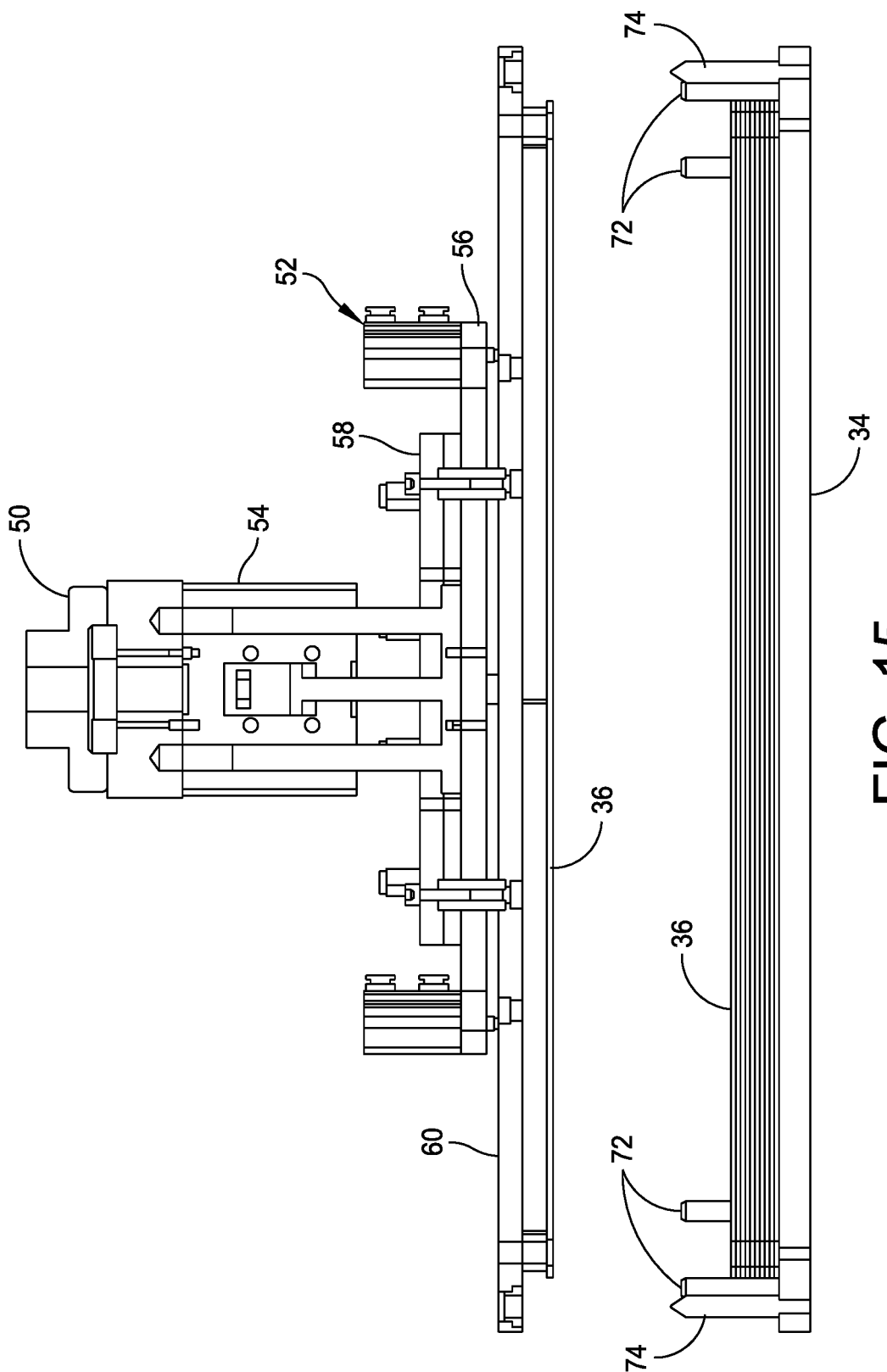
FIG. 15 is a cross-sectional side view of the end effector moved away from the sheet or film fixture.

FIGS. 14 and 14A illustrate the end effector 52 fully engaged with the laminate sheet fixture 34. As shown, the alignment pins 74 are fully received within their respective openings 76. At this point, the vacuum is operated to provide a vacuum to the suction cups 68 disposed around the periphery of the bottom surface of the bottom floating plate 60. When applied, the vacuum created by the suction cups 68 enable the bottom floating plate 60 to releasably secure the laminate sheet 36 to the bottom floating plate 60. Once secured, the end effector 52 is raised by operating the movable arm 48 to move the end effector 52 upwardly in the z-axis direction. FIG. 15 illustrates the end effector 52 raised above the laminate sheet fixture 34 having the laminate sheet 36 secured to the bottom floating plate 60 of the end effector 52. As shown, the laminate sheet fixture 34 includes pins 72 positioned at the corners of the laminate sheets 36 to center the laminate sheets on the fixture.

Figure 16:
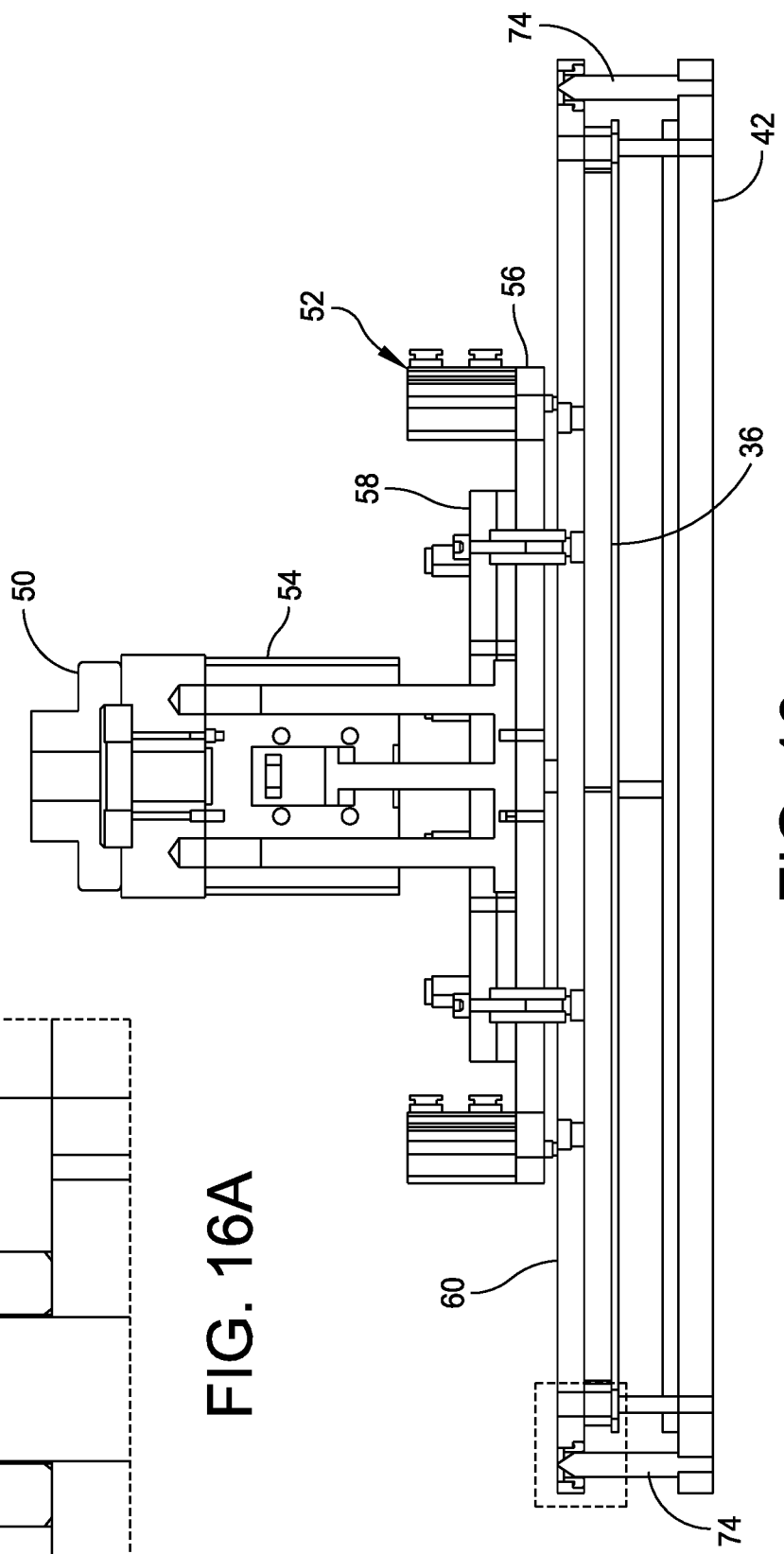
FIG. 16 is a cross-sectional side view of the end effector moved toward a board layup fixture.
Figure 16A:
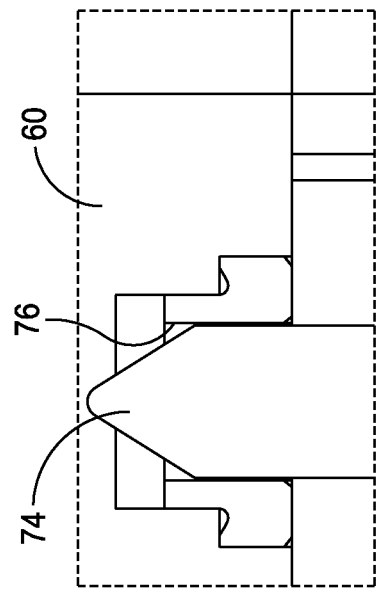
FIG. 16A is an enlarged cross-sectional view of a pin of the board layup fixture used to align the end effector and the board layup fixture with the pin being partially received in the opening of the end effector.

While raising the end effector 52 or after raising the end effector 52, the movable arm 48 is moved to position the end effector 52 over the board layup fixture 42 to deposit the laminate sheet 36 on the board layup fixture 42. FIGS. 16 and 16A illustrate the end effector 52 being moved downward over the board layup fixture 42, with the alignment pins 74 being received in their respective openings 76 to grossly align the end effector 52 with the board layup fixture 42. To achieve the downward movement of the end effector 52, the movable arm 48 is operated to move the end effector 52 downwardly in the z-axis direction. At this point, the source of air is controlled to deliver pressurized air to the ports 66, thereby providing an air cushion between the top floating plate 58 and the fixed plate 56. This facilitates a small amount of movement between the top and bottom floating plates 58, 60 and the fixed plate 56 when aligning the bottom floating plate 60 with the board layup fixture 42.

Figure 18:
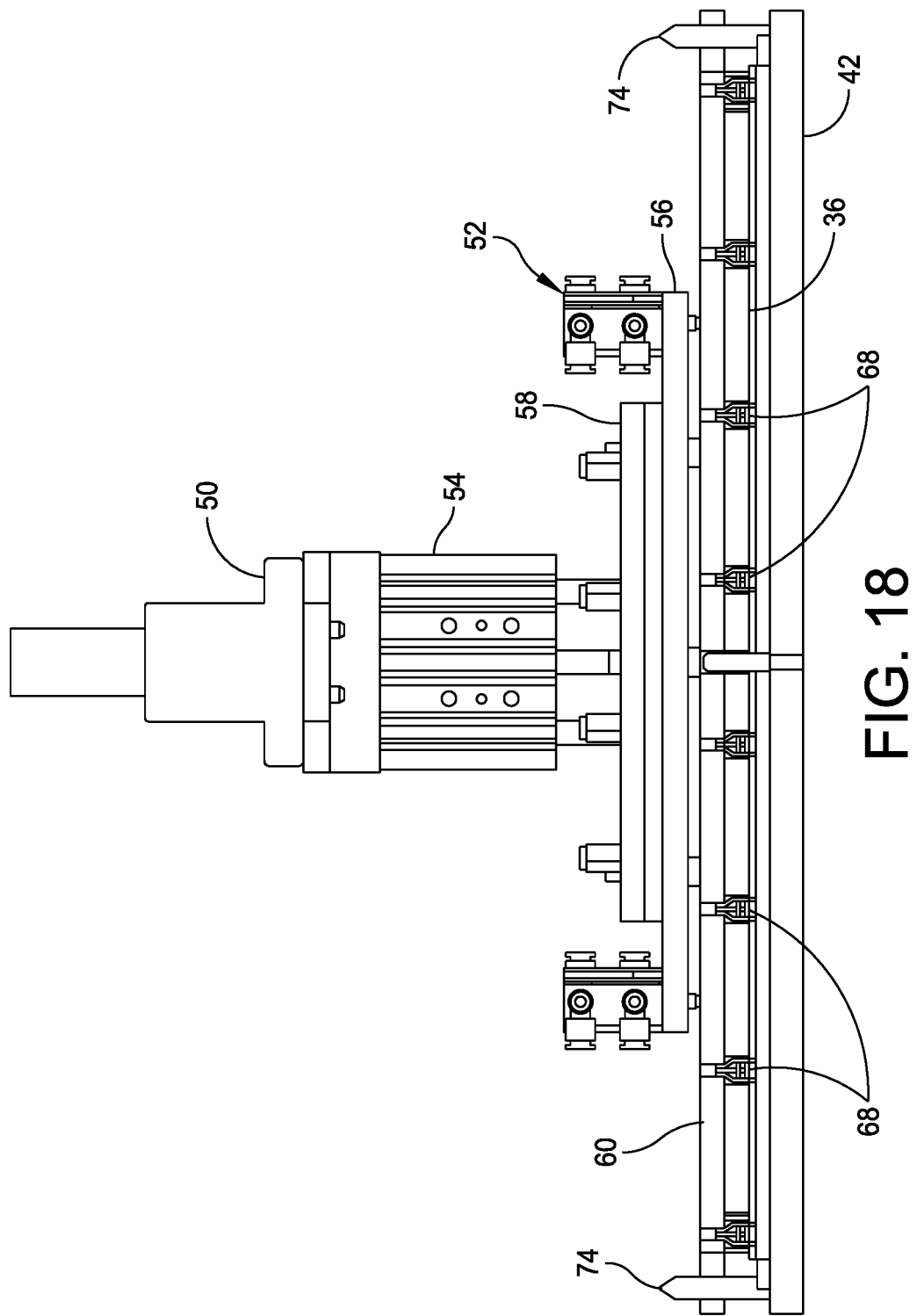
FIG. 18 is a cross sectional view of the end effector moved fully toward the board layup fixture to place the laminate sheet in the board layup fixture.

FIGS. 17 and 17A illustrate the end effector 52 fully engaged with the board layup fixture 42. The alignment pins 74 are fully received within their respective openings 76. In addition, as shown in FIG. 17A, the pins 78 are received within their respective slots 80 in the laminate sheet 36 to enable the laminate sheet 36 to be received by the board layup fixture 42. At this point, as shown in FIG. 18, the vacuum is shut off to disable the vacuum to the suction cups 68 to release the laminate sheet 36 from the bottom floating plate 60.

In one embodiment, the end effector 52 can be configured to include four tamping cylinders (shown in FIG. 7) that can be optionally used to ensure that the laminate sheet 36 is placed flat in the board layup fixture 42. These cylinders are only present in the laminate layer end effector 52 and not in the bond film end effector 52a.

The aforementioned process can be repeated alternately, for example, by removing bond films 40 from the bond film fixture 38 with end effector 52a and placing the bond films 40 on the board layup fixture 42 and removing laminate sheets 36 from the laminate sheet fixture 34 with end effector 52 and placing the laminate sheets 36 in the board layup fixture 42 until the completed laminated product is produced. The completed laminated product remains on the board layup fixture 42 and is removed from the automation cell. Additional laminated products may be assembled by replacing the board layup fixture 42 and repeating the process of placing laminate sheets 36 and bond films 40 to the new board layup fixture.

In some embodiments, the only gross x-axis and y-axis compliance in the bond film end effector 52a includes the same holes 76 to locate to the pins 74 in the fixtures. The bond film end effector 52a does not utilize the slots cut in the bond film to finely locate it to the four pins 78 in the board layup fixture. Rather, the bond film slots are allowed to deform around these pins 78 when they are placed (this is because the bond film location requires less precision than the laminate sheet location, so some deformation is allowable). Moreover, the bond film end effector 52a can be configured to not rely on the air cushion used by the laminate layer end effector 52, because of ability for the bond film slots to slightly deform around the pins 78.

Figure 19:
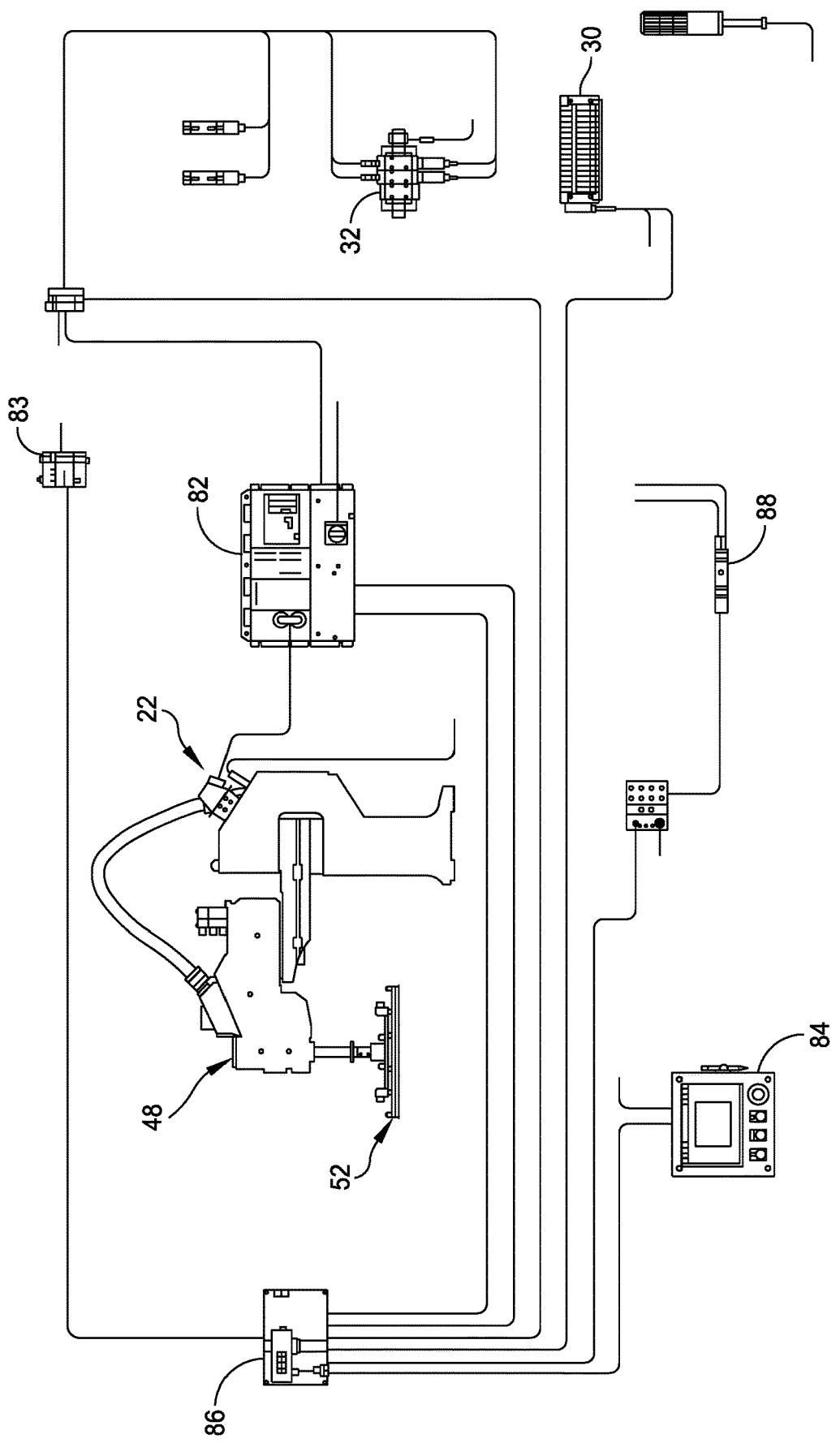
FIG. 19 is a functional diagram of the apparatus.

Referring to FIG. 19, a functional diagram of the apparatus 20 is provided. As shown, the apparatus 20 includes a controller 82 to control the operation of the movable arm 48. It should be noted that the controller 82 is specific to controlling the motion of the robotic arm 48. A programmable logic controller 83 in FIG. 19, controls the end effector 52 or 52a and the guided pneumatic actuator 54. The logic controller 83 controls the valves for air and vacuum to the end effector 52 or 52a and provides the overall program for picking and placing operations. The controller 82 controls the motion of the robotic arm 48 when directed by the programmable logic controller 83. Power to the apparatus 20 is provided by a power supply 84 in which an ethernet switch controls signals sent between various devices on the machine. The programmable logic controller 83 and the power supply 84 operate to control the operation of the valve bank 30, the air valves 32 and a vacuum ejector 88, which is configured to provide a vacuum to the suction cups 68.

A process of assembling a PCB fabricated from laminate sheets and bond films includes providing laminate sheets in a laminate sheet fixture and providing bond films in a bond film nest fixture. Each laminate sheet may be fabricated from a flat sheet of dielectric material having a layer of copper laminated to the sheet. Any suitable dielectric material can be selected. The copper layer can be etched or milled to form a desired electrical pattern. Each bond film may be fabricated from a thermoplastic material, such as fluorinated ethylene propylene (FEP).

The process further includes employing the robotic device to alternatingly place laminate sheets and bond films in the board layup fixture. Specifically, the movable arm of the robotic device is positioned over the laminate sheet fixture so that the end effector is positioned directly over the fixture. The robotic device is operated to releasably secure a single laminate sheet, move the laminate sheet over the board layup fixture, and deposit the laminate sheet in the board layup fixture. Next, the movable arm of the robotic device is positioned over the bond film fixture so that the end effector is positioned directly over the fixture. The robotic device is operated to releasably secure a single bond film, move the bond film over the board layup fixture, and deposit the bond film in the board layup fixture. This process continues until the entire laminated product is completed. The laminate sheets and bond films are cured under pressure and temperature to form an integral final product.

In some embodiments, the apparatus is an enabler for touch time reduction in traditional PCB manufacturing and an enabler for fully automated "dry" AMT approach for manufacturing RF circuit card assemblies.

In some embodiments, the pick tool has low friction X-Y compliance, utilizing a platen air cushion between a fixed plate and a vacuum tool, enabling accurate alignment to pick/place pin features. The pick tool contains an array of 8 mm diameter vacuum or suction cups that contact the laminate layer within the ¾-inch margin, leaving the sensitive central region untouched. The pick nest fixture includes two pins that center the pick tool when it picks from the nest. When placing the laminate sheet with the pick tool to the place nest, alignment pins in the place nest locate the pick tooling grossly, constraining the tool enough to allow the four pins in the board layup fixture to finely locate to the four slots in the laminate layer.

Embodiments of the apparatus enable a thin flexible film to be loaded to the bond film fixture over four locating pins corresponding to the four slots in the film. The pick nest fixture includes two pins that center the pick tooling when it picks from the nest. The pick tooling is also located at the placement nest by the same pins.

Embodiments of the apparatus provide a pin-hole vacuum gripper for thin flexible films. Vacuum is pulled through array of holes in a plate.

Embodiments of the apparatus provide fixture pins begin to locate product by slots. An air platen reduces friction to prevent damage to slots in product.

Embodiments of the apparatus enables an AMT process to be performed on a larger scale and much more quickly.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

What is claimed is:

1. An apparatus to automatically place layers of a printed circuit board on a fixture, the apparatus comprising:
    a robotic device including
        a base that is secured to a surface,
        an upright column that extends upwardly from the base, and
        a movable arm rotatably coupled to the upright column, the movable arm being configured to rotate about a vertical axis defined by the upright column, and further configured to rotate from a position in which the movable arm is disposed over a laminate sheet fixture and to pick up a laminate sheet to a position in which the movable arm is disposed over a board layup fixture to deposit the laminate sheet in the board layup fixture, and from a position in which the movable arm is disposed over a bond film fixture and to pick up a bond film to a position in which the movable arm is disposed over the board layup fixture to deposit the bond film in the board layup fixture,
    wherein the movable arm of the robotic device further is configured to move in x- axis and y-axis directions,
    wherein the movable arm is configured to vary a radius of arc and travel about the vertical axis and configured to lower and raise an end effector supported by the movable arm in the z-axis direction,
    wherein the movable arm includes a user flange that is configured to receive and mount thereon the end effector,
    wherein the end effector includes an actuator that is secured to the user flange and to a fixed plate, the movable arm being configured to move the fixed plate vertically in the z-axis direction, and
    wherein the fixed plate is disposed on a horizontal plane and supports a vacuum tool having top floating plate and a bottom floating plate, which is secured to the top floating plate, the top floating plate and the bottom floating plate being configured to move relative to the fixed plate in the x-axis and y-axis directions.

2. The apparatus of claim 1, wherein the robotic device is a selective compliance assembly robot arm.

3. The apparatus of claim 1, wherein the end effector is configured to pick up the laminate sheet from the laminate sheet fixture and place the laminate sheet on the board layup fixture and to the bond film from the bond film fixture and place the bond film on the board layup fixture.

4. The apparatus of claim 1, wherein the top floating plate includes a plurality of ports, which are connected to a source of air, the ports providing an air cushion between the top floating plate and the fixed plate to facilitate a small amount of movement between the top and bottom floating plates and the fixed plate when aligning the bottom floating plate with one of the laminate sheet, bond film and board layup fixtures.

5. The apparatus of claim 1, wherein the bottom floating plate includes a plurality of suction cups, which are configured to releasably secure the laminate sheet to the bottom floating plate.

6. The apparatus of claim 5, wherein each of the suction cups is secured to a vacuum source, and by applying a vacuum to the suction cups, the bottom floating plate releasably secures the laminate sheet to the bottom floating plate and by terminating the vacuum to the suction cups, the bottom floating plate releases the laminate sheet from the bottom floating plate.

7. The apparatus of claim 6, wherein the suction cups are disposed around a periphery of a bottom surface of the bottom floating plate.

8. The apparatus of claim 1, wherein the bottom floating plate includes a plurality of vacuum ports, which are configured to releasably secure the bond film to the bottom floating plate.

9. The apparatus of claim 8, wherein each of the vacuum ports is secured to a vacuum source, and by applying a vacuum to the vacuum ports, the bottom floating plate releasably secures the bond film to the bottom floating plate and by terminating the vacuum to the vacuum ports, the bottom floating plate releases the bond film from the bottom floating plate.

10. The apparatus of claim 9, wherein the vacuum ports are uniformly arranged on a bottom surface of the bottom floating plate.

11. The apparatus of claim 1, wherein each of the laminate sheet fixture, the bond film fixture and the board layup fixture include a flat plate having at least one alignment pin, which is provided to initially position the bottom floating plate with respect to one of the laminate sheet, bond film, or board layup fixture when moving the end effector of the robotic device to one of the laminate sheet, bond film, or board layup fixture.

12. The apparatus of claim 11, wherein the at least one alignment pin is received within an opening provided in the bottom floating plate.

13. The apparatus of claim 11, wherein each of the fixtures further includes a plurality of additional pins to finely locate the laminate sheet with slots provided in the laminate sheet.

14. The apparatus of claim 1, further comprising a table configured to support the robotic device, the base of the robotic device being secured to the table, the table being configured to support complimentary components of the robotic device.

15. The apparatus of claim 1, further comprising a controller to control the operation of the robotic device.

16. An apparatus to automatically place layers of a printed circuit board on a fixture, the apparatus comprising:
   a robotic device including
      a base that is secured to a surface,
      an upright column that extends upwardly from the base, and
      a movable arm rotatably coupled to the upright column, the movable arm being configured to rotate about a vertical axis defined by the upright column, and further configured to rotate from a position in which the movable arm is disposed over a laminate sheet fixture and to pick up a laminate sheet to a position in which the movable arm is disposed over a board layup fixture to deposit the laminate sheet in the board layup fixture, and from a position in which the movable arm is disposed over a bond film fixture and to pick up a bond film to a position in which the movable arm is disposed over the board layup fixture to deposit the bond film in the board layup fixture,
   wherein an end effector includes an actuator that is secured to a user flange and to a fixed plate, the movable arm being configured to move the fixed plate vertically in a z-axis direction, and
   wherein the fixed plate is disposed on a horizontal plane and supports a vacuum tool having top floating plate and a bottom floating plate, which is secured to the top floating plate, the top floating plate and the bottom floating plate being configured to move relative to the fixed plate in x-axis and y-axis directions.

17. The apparatus of claim 16, wherein the top floating plate includes a plurality of ports, which are connected to a source of air, the ports providing an air cushion between the top floating plate and the fixed plate to facilitate a small amount of movement between the top and bottom floating plates and the fixed plate when aligning the bottom floating plate with one of the laminate sheet, bond film and board layup fixtures.

18. The apparatus of claim 16, wherein the bottom floating plate includes a plurality of suction cups, which are configured to releasably secure the laminate sheet to the bottom floating plate.

19. The apparatus of claim 18, wherein each of the suction cups is secured to a vacuum source, and by applying a vacuum to the suction cups, the bottom floating plate releasably secures the laminate sheet to the bottom floating plate and by terminating the vacuum to the suction cups, the bottom floating plate releases the laminate sheet from the bottom floating plate.

20. The apparatus of claim 19, wherein the suction cups are disposed around a periphery of a bottom surface of the bottom floating plate.

21. The apparatus of claim 16, wherein the bottom floating plate includes a plurality of vacuum ports, which are configured to releasably secure the bond film to the bottom floating plate.

22. The apparatus of claim 21, wherein each of the vacuum ports is secured to a vacuum source, and by applying a vacuum to the vacuum ports, the bottom floating plate releasably secures the bond film to the bottom floating plate and by terminating the vacuum to the vacuum ports, the bottom floating plate releases the bond film from the bottom floating plate.

23. The apparatus of claim 22, wherein the vacuum ports are uniformly arranged on a bottom surface of the bottom floating plate.

\* \* \* \* \*